United States Patent
Guicquero et al.

(10) Patent No.: US 10,402,679 B2
(45) Date of Patent: Sep. 3, 2019

(54) ON-THE-FLY PROCESSING OF DATA IN AN ACQUISITION SYSTEM

(71) Applicant: Commissariat à l'Energie Atomique et aux Energies Alternatives, Paris (FR)

(72) Inventors: William Guicquero, Bures-sur-Yvette (FR); Arnaud Verdant, Saint-Nazaire-les Eymes (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 89 days.

(21) Appl. No.: 15/865,000

(22) Filed: Jan. 8, 2018

(65) Prior Publication Data
US 2018/0197038 A1 Jul. 12, 2018

(30) Foreign Application Priority Data
Jan. 9, 2017 (FR) ..................................... 17 50160

(51) Int. Cl.
*G06K 9/40* (2006.01)
*G06K 9/46* (2006.01)
(Continued)

(52) U.S. Cl.
CPC ........... *G06K 9/4647* (2013.01); *G06F 17/10* (2013.01); *G06K 9/00255* (2013.01);
(Continued)

(58) Field of Classification Search
CPC ... G06K 9/00–98; G06T 7/00–97; G06T 3/40; H03M 7/00–707; G06F 17/10; H04N 5/3765; H04N 5/378
See application file for complete search history.

(56) References Cited

U.S. PATENT DOCUMENTS 6,480,227 B1 * 11/2002 Yoneyama ........... H04N 5/3765
   348/308
2007/0189601 A1 * 8/2007 Lee ....................... G06K 9/6232
   382/159

(Continued)

OTHER PUBLICATIONS

Preliminary Search Report, French Patent Application No. 1750160, dated Oct. 31, 2017, 2 pages.

(Continued)

*Primary Examiner* — Sean T Motsinger
(74) *Attorney, Agent, or Firm* — Moreno IP Law LLC

(57) ABSTRACT

An electronic system including: a sensor (201) capable of successively supplying n vectors $L_i$ each including k values $L_i(j)$; and an electronic device (403) for processing on the fly the values measured by the sensor, including: a first stage (407) capable, each time a vector $L_i$ has been supplied by the sensor, of multiplying the k values $L_i(j)$ of vector $L_i$ by respectively k coefficients $b_i(j)$, and of supplying a vector $T1_i$ of k values $T1_i(j)$; a second stage (409) capable, each time a vector $T1_i$ has been supplied, of multiplying vector $T1_i$ by a matrix $\tilde{A}$ of k*p coefficients, and of supplying a vector $T2_i$ of p values $T2_i(l)$; and a third stage (411) capable of digitally integrating the n vectors $T2_i$ and of supplying an output vector IT of p values IT(l).

28 Claims, 5 Drawing Sheets

(51) Int. Cl.
*G06T 3/40* (2006.01)
*G06K 9/00* (2006.01)
*G06K 9/62* (2006.01)
*H04N 5/378* (2011.01)
*H04N 5/376* (2011.01)
*G06K 9/20* (2006.01)
*G06F 17/10* (2006.01)
*H03M 7/00* (2006.01)
*H03M 7/30* (2006.01)

(52) U.S. Cl.
CPC ........... *G06K 9/209* (2013.01); *G06K 9/6256* (2013.01); *G06K 9/6269* (2013.01); *G06T 3/40* (2013.01); *H03M 7/00* (2013.01); *H03M 7/3062* (2013.01); *H03M 7/3082* (2013.01); *H04N 5/378* (2013.01); *H04N 5/3765* (2013.01)

(56) References Cited

U.S. PATENT DOCUMENTS

| | | | |
|---|---|---|---|
| 2009/0091615 A1* | 4/2009 | Tan | G06T 3/00 348/125 |
| 2014/0240492 A1* | 8/2014 | Lee | H04N 5/2256 348/136 |
| 2015/0002734 A1* | 1/2015 | Lee | H04N 5/2256 348/367 |
| 2018/0197038 A1* | 7/2018 | Guicquero | G06F 17/10 |

OTHER PUBLICATIONS

Duarte, M.F. et al., "Structured Compressed Sensing: From Theory to Applications," IEEE Transactions on Signal Processing, vol. 59, No. 9, Sep. 2011, pp. 4053-4085.

Li, K., "State of the art and prospects of structured sensing matrices in compressed sensing," Front. Comput. Sci., vol. 9, No. 5, 2015, pp. 665-677.

Aggarwal, H.K. et al., "Compressive Sensing Multi-spectral Demosaicing from Single Sensor Architecture," IEEE China Summit & International Conference on Signal and Information Processing (ChinaSIP), 2014, pp. 334-338.

Rueda, H. et al., "Multi-spectral compressive snapshot imaging using RGB image sensors," Optics Express, vol. 23, No. 9, Apr. 30, 2015, 15 pages.

Lorenzi, L. et al., "Adaptive Basis Pursuit Compressive Sensing Reconstruction with Histogram Matching," IEEE Geoscience and Remote Sensing Symposium (IGARSS), 2013, pp. 872-875.

Katic, N. et al., "Column-Separated Compressive Sensing Scheme for Low Power CMOS Image Sensors," IEEE 11th International New Circuits and Systems Conference (NEWCAS), 2013, 4 pages.

* cited by examiner

ON-THE-FLY PROCESSING OF DATA IN AN ACQUISITION SYSTEM

FIELD

The present disclosure relates to the on-the-fly processing of data in a data acquisition system. It more specifically aims at a data acquisition system comprising a sensor capable of sequentially supplying a plurality of measured values, and at a device of on-the-fly processing of the values supplied by the sensor, the processing device enabling to perform a projection or transposition of a set of values supplied by the sensor during a time interval, in a specific representation domain different from the acquisition domain. The provided solution will be more specifically described in relation with examples of application to imaging systems. Other applications are however possible.

BACKGROUND

In many applications, an image sensor is coupled to a processing device enabling to extract, from the images acquired by the sensor, data useful for the application.

Conventionally, the processing device is capable of transposing or projecting an image acquired by the sensor in a specific representation domain different from the acquisition domain, to exacerbate certain characteristics of the image selected according to the considered application.

For example, in a face detection application, the image supplied by the sensor may be projected in a representation domain selected to highlight a specific pattern, easily detectable, when a face is present in the image.

The image projection operation generally goes along with a decrease in dimensions, that is, the dimension (number of values) of the image projection is generally smaller than the dimension of the original image. This enables to decrease the complexity and the memory and energy resource needs of possible subsequent processings.

The projection of an image supplied by the sensor in a representation domain different from the acquisition domain is conventionally performed by multiplying the original image by a transition matrix. Such an operation however requires relatively significant memory and calculation resources. This may raise an issue in certain applications, for example, so-called real-time applications, where images are desired to be processed on the fly, along their acquisition by the sensor.

It would be desirable to have an acquisition system comprising a sensor capable of successively supplying a plurality of measured values, and a device of on-the-fly processing of the values supplied by the sensor, the processing device enabling to perform a projection of a set of values supplied by the sensor is a representation domain different from the acquisition domain, the system overcoming all or part of the disadvantages of known systems.

SUMMARY a sensor capable of successively supplying n vectors $L_i$, each comprising k measured values $L_i(j)$, where n and k are integers with $n \geq 2$ and $k \geq 1$, i is an integer in the range from 1 to n, and j is an integer in the range from 1 to k; and an electronic device for processing on the fly the values measured by the sensor, capable of providing a projection $\hat{G}(A,B)*I$, in a representation domain of dimension p, of the set of n*k values $L_i(j)$ measured by the sensor, p being an integer with $p \geq 1$, I being a column vector of n*k values, formed by the set of n*k values $L_i(j)$ measured by the sensor, and $\hat{G}(A,B)$ being a projection matrix of p rows and n*k columns such that $\hat{G}(A,B)=S*A*B$, where B is a square diagonal matrix with n*k rows and n*k columns, and A is a matrix of n*k columns and p*n rows formed of p*k square sub-matrices of dimensions n*n arranged in p rows and k columns, each square sub-matrix being a diagonal matrix having the n identical values on its diagonal, and where S is a matrix of p rows and p*n columns, having each row of rank 1, 1 being an integer in the range from 1 to p, formed by a vector comprising (1−I)*n zero coefficients followed by n unit coefficients followed by (p−1)*n zero coefficients, the electronic processing device comprising:

a first stage capable, each time a vector $L_i$ has been supplied by the sensor and before the next vector $L_i$ is supplied, of multiplying the k values $L_i(j)$ of vector $L_i$ by respectively k coefficients $b_i(j)$, and of supplying a vector $T1_i$ of k values $T1_i(j)$ resulting from the multiplication;

a second stage capable, each time a vector $T1_i$ has been supplied by the first stage and before the next vector $T1_i$ is supplied, of multiplying vector $T1_i$ by a matrix $\tilde{A}$ of k*p coefficients, and of supplying a vector $T2_i$ of p values $T2_i(l)$ resulting from the multiplication, where l is an integer in the range from 1 to p; and a third stage capable of digitally integrating the n vectors $T2_i$ successively supplied by the second stage and of supplying an output vector IT of p values IT(l), corresponding to projection $\hat{G}(A,B)*I$.

Another embodiment provides an electronic system comprising:

a sensor capable of successively supplying n vectors $L_i$ each comprising k measured values $L_i(j)$, where n and k are integers with $n \geq 2$ and $k \geq 1$, i is an integer in the range from 1 to n, and j is an integer in the range from 1 to k; and an electronic device for processing on the fly the values measured by the sensor, capable of providing a projection $\hat{G}(A,B)*I$, in a representation domain of dimension p, of the set of n*k values $L_i(j)$ measured by the sensor, p being an integer with $p \geq 1$, I being a column vector of n*k values, formed by the set of n*k values $L_i(j)$ measured by the sensor, and $\hat{G}(A,B)$ being a projection matrix of p rows and n*k columns such that $\hat{G}(A,B)=S*B*A$, where B is a square diagonal matrix with p*n columns and p*n rows, where A is a matrix of n*k columns and p*n rows formed of p*k square sub-matrices of dimensions n*n arranged in p rows and k columns, each square sub-matrix being a diagonal matrix having n identical values on its diagonal, and where S is a matrix of p rows and p*n columns, having each row of rank 1, 1 being an integer in the range from 1 to p, formed by a vector comprising (1-1)*n zero coefficients followed by n unit coefficients followed by (p−1)*n zero coefficients, the electronic processing device (403) comprising:

a first stage capable, each time a vector $L_i$ has been supplied by the sensor and before the next vector $L_i$ is supplied, of multiplying vector $L_i$ by a matrix $\tilde{A}$ of k*p coefficients, and of supplying a vector $T1_i$ of p values $T1_i(l)$ resulting from the multiplication, where l is an integer in the range from 1 to p;

a second stage capable, each time a vector $T1_i$ has been supplied by the first stage and before the next vector $T1_i$ is supplied, of multiplying the p values $T1_i(l)$ of vector $T1_i$ by respectively p coefficients $b_i(l)$, and of supplying a vector $T2_i$ of p values $T2_i(l)$ resulting from the multiplication; and a third stage capable of digitally integrating the n vectors $T2_i$ successively supplied by the second stage and of supplying an output vector IT of p values IT(l), corresponding to projection $\hat{G}(A,B)*I$.

According to an embodiment, the first, second, and third stages are cascaded and are rated by a same clock signal, so that each stage executes the calculation operation which is assigned thereto between two consecutive rising or falling edges of the clock signal.

According to an embodiment, k is an integer greater than or equal to 2.

According to an embodiment, the processing device further comprises a fourth stage capable of receiving vector IT of dimension p supplied by the third stage and of making one or a plurality of decisions according to the value of vector IT.

According to an embodiment, the fourth stage is capable of classifying the set of n*k values measured by the sensor in a selected category from a plurality of predefined categories, according to the value of vector IT.

According to an embodiment, the fourth stage is capable of controlling a user electronic device according to the value of vector IT.

According to an embodiment, the sensor is an image sensor comprising a plurality of pixels arranged in n rows and k columns, capable of successively supplying n vectors $L_i$, each vector $L_i$ corresponding to the set of output values of the pixels of a same row of the sensor.

According to an embodiment, the output values of the sensor pixels are digital values quantized over a plurality of bits.

According to an embodiment, the output values of the sensor pixels are binary values, and the sensor is read from a plurality of times, the processing device supplying, for each read operation, a projection of the binary image supplied by the sensor, the system being capable of adding the projections of the binary images successively supplied by the processing device to supply a final projected image.

According to an embodiment, the sensor is a histogram sensor comprising an asynchronous multispectral photosensitive sensor and a histogram construction circuit having an input connected to an output of the photosensitive sensor.

According to an embodiment, the histogram construction circuit is capable of supplying k histograms of a scene seen by the photosensitive sensor, respectively corresponding to k different spectral bands of the scene.

According to an embodiment, the histogram construction circuit is capable of supplying, for each spectral band, m histograms of the scene having different scales.

According to an embodiment, the system comprises a plurality of juxtaposed identical sensors and, for each sensor, an electronic device for processing on the fly the values measured by the sensor, the system being capable of, for each sensor, classifying a set of values measured by the sensor in a selected category from a plurality of predefined categories, according to the value of the vector IT calculated by the processing device associated with the sensor.

According to an embodiment, the system further comprises an electronic training device comprising:

a reference memory storing at least one reference value for example corresponding to coefficients of a reference projection G or to at least a pair of reference input/output values, each pair including a reference vector I and an expected associated reference vector IT;

an optimum value calculation device capable of searching for coefficients of matrices A and B enabling to approach at best said at least one reference value; and a device for writing the coefficients of matrices A and B into a storage memory of the electronic processing device,
where the stored values may be modified during a training process on request of the optimum value calculation device.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION OF THE PRESENT EMBODIMENTS

Figure 1:
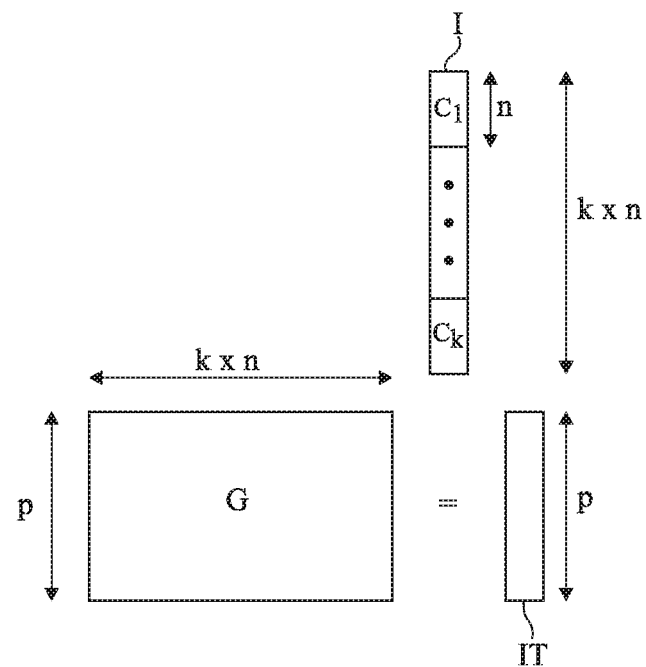
FIG. 1 schematically illustrates an example of an operation of projection, in a specific representation domain, of an image supplied by an image sensor.

The same elements have been designated with the same reference numerals in the various drawings and, further, the various drawings are not to scale. For clarity, only those steps and elements which are useful to the understanding of the described embodiments have been shown and are detailed. In particular, the sensors of the acquisition systems described hereafter have not been detailed, the described embodiments being compatible with any sensor capable of sequentially supplying electric signals representative of values measured by the sensor. Further, the electronic circuits capable of implementing the operations described hereafter of processing of the signals supplied by the sensors have not been detailed, the implementation of such circuits being within the abilities of those skilled in the art based on the functional indications of the present description. It should in particular be noted that the processing operations described hereafter may be totally or partly implemented by a generic calculation circuit, for example comprising a microprocessor, programmed to implement the described processing operations. As a variation, the processing operations described hereafter may be totally or partly implemented by specific electronic circuits. Further, not all the applications where acquisition systems of the type described hereafter may be used have been detailed, and the described embodiments may be adapted to any application where a set of data sequentially supplied by a sensor is desired to be projected in a specific representation domain. Unless otherwise specified, expressions "approximately", "substantially", and "in the order of" mean to within 10%, preferably to within 5%.

As indicated hereabove, electronic systems where a sensor sequentially supplies data or signals representative of values measured by the sensor are here generally considered.

As an illustration, a system comprising an image sensor comprising n*k pixels arranged in an array of n rows and k columns is considered, where n and k are integers. In this example, during a phase of reading of an image acquired by the sensor, the output values of the pixels are read row by row, that is, all the pixels of a same row are simultaneously read from, and the pixels of different rows are sequentially read from. In other words, during a phase of reading of an image acquired by the sensor, the sensor successively supplies n vectors $L_1, \ldots, L_n$, each vector $L_i$ (i being an integer in the range from 1 to n) comprising k values $L_i(1), \ldots L_i(k)$, each value $L_i(j)$ (j being an integer in the range from 1 to k) corresponding to the output value of the pixel of the row of rank i and of the column of rank j. Image I supplied by the sensor is formed by the set of n*k values $L_i(j)$ read during the read phase.

FIG. 1 schematically illustrates an example of an operation of projection of an image I supplied by an image sensor such as defined hereabove, in a representation domain different from the acquisition domain.

Image I is shown in FIG. 1 in the form of a column vector of k*n values, corresponding to the concatenation of k column vectors $C_1, \ldots, C_k$, each vector $C_j$ (j being an integer in the range from 1 to k) comprising n values $C_j(1), \ldots, C_j(n)$ respectively corresponding to the output values of the n pixels of the column of rank j of the sensor (that is, respectively equal to values $L_1(j), \ldots, L_n(j)$).

In the example of FIG. 1, the projection of image I in a representation domain adapted to the needs to a specific application comprises multiplying column vector I defined hereabove by a transition matrix G of k*n columns and p rows, where p is an integer designating the dimension of the projection or transpose of the image (that is, of the vector resulting from the image projection operation).

The result of this multiplication is a vector IT of p values corresponding to the projection of image I in the representation domain of dimension p defined by matrix G.

Figure 2:
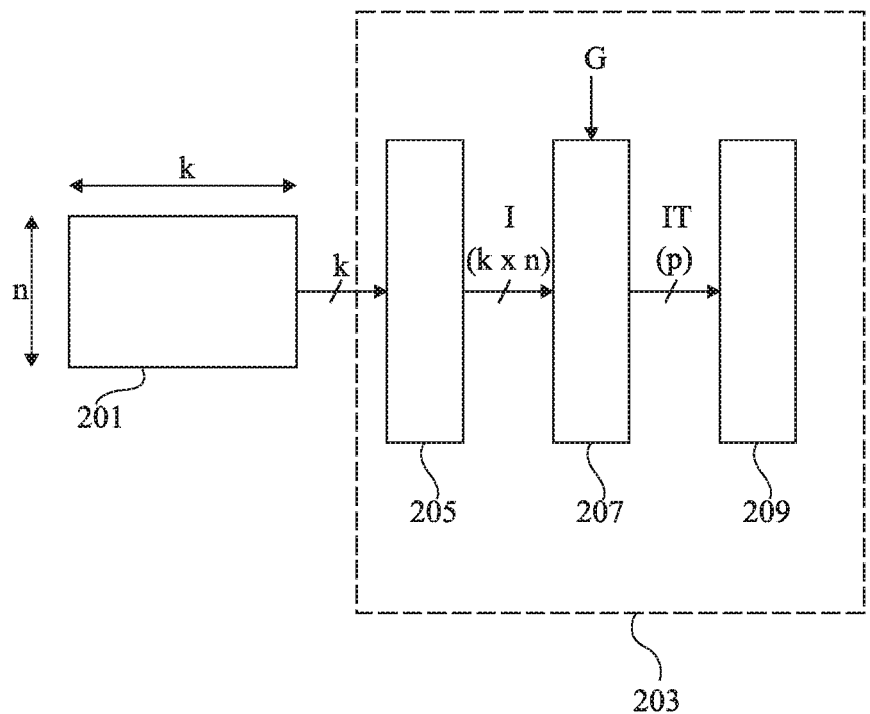
FIG. 2 is a block diagram of an example of an acquisition system comprising an image sensor and a processing device capable of implementing an operation of projection, in a specific representation domain, of an image supplied by the sensor.

FIG. 2 is a block diagram of an example of an acquisition system comprising an image sensor 201 of the above-defined type and a processing device 203 capable of implementing the operation described in relation with FIG. 1 of projection of an image I supplied by the sensor, in a representation domain of dimension p defined by transition matrix G.

In this example, processing device 203 comprises a memory 205 of dimension k*n, capable of simultaneously storing the k*n values of the pixels of image I.

During a phase of reading of an image acquired by sensor 201, the n output vectors $L_1, \ldots, L_n$ successively supplied by the sensor are written into memory 203 to construct image I.

Processing device 203 further comprises a stage 207 capable of executing the above-described operation of multiplication of image I of k*n values by transition array G of k*n*p values, to supply output vector IT of dimension p, corresponding to the projection of image I in the representation domain defined by matrix G.

Processing device 203 may further comprise a decision block 209 capable of receiving vector IT of dimension p calculated by multiplication stage 207 and of making one or a plurality of decisions according to the value of vector IT. As an example, decision block 209 is capable of classifying image I in a category selected from a plurality of predefined categories, according to the value of vector IT.

A disadvantage of the system of FIG. 2 is that processing device 203 has to wait for the entire image I acquired by the sensor to have been read and written into memory 205 to be able to perform the operations of projection calculation via multiplication stage 207. The time taken to read image I acquired by the sensor is thus lost time, during which the projection calculation operations are not implemented.

Further, in the system of FIG. 2, memory 205 of processing device 203 should be relatively large to be able to contain the entire image I acquired by the sensor.

Further, the system of FIG. 2 should store all the n*k*p values of transition matrix G, to enable stage 207 to perform matrix multiplication operation G*I. Here again, this requires significant memory resources.

Figure 3:
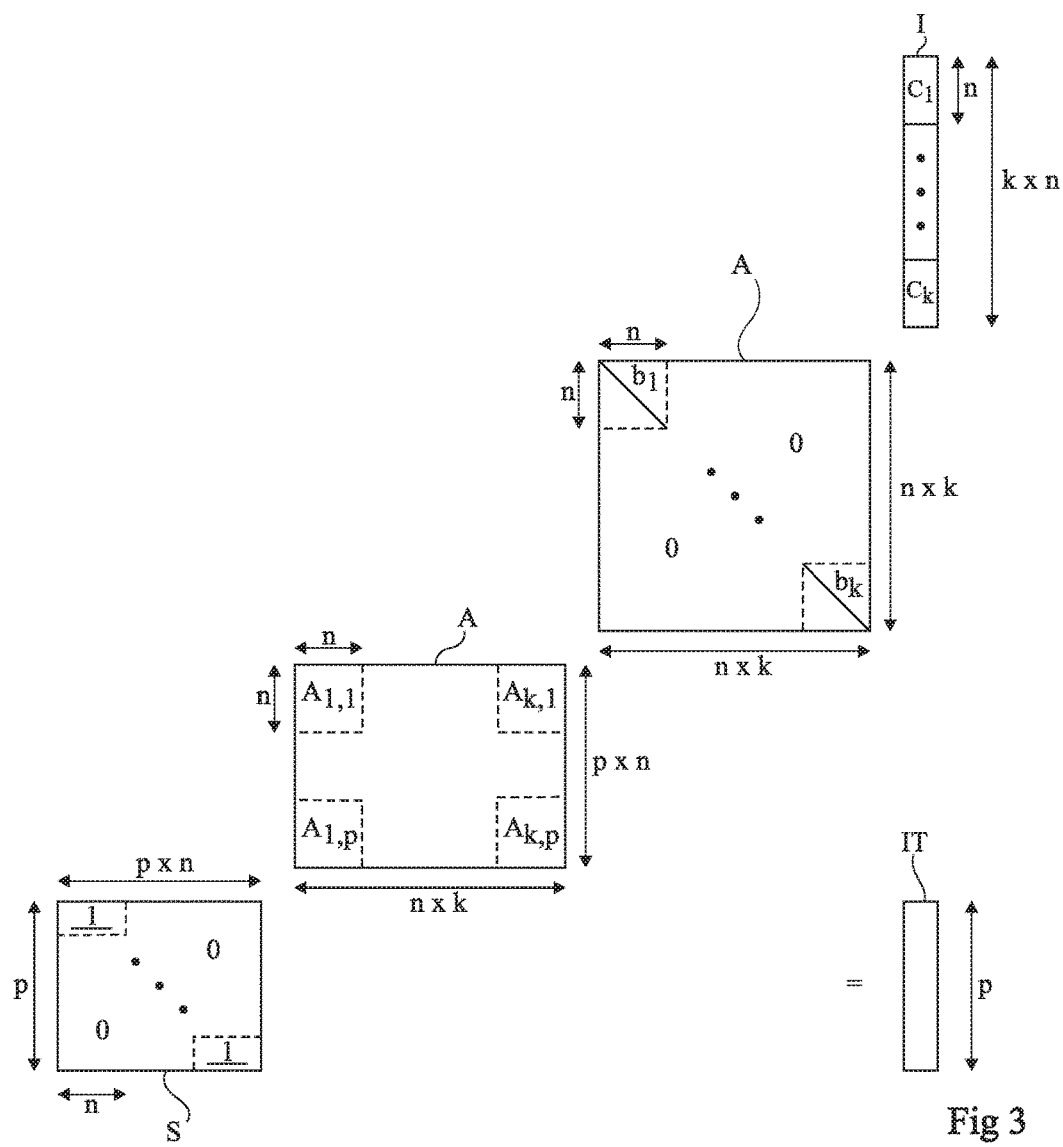
FIG. 3 schematically illustrates an embodiment of an operation of projection, in a specific representation domain, of an image supplied by an image sensor.

FIG. 3 schematically illustrates an embodiment of an operation of projection of an image I supplied by an image sensor such as defined hereabove, in a representation domain different from the acquisition domain.

As in the example of FIG. 1, image I is shown in FIG. 3 in the form of a column vector of k*n values corresponding to the concatenation of the k column vectors $C_1, \ldots C_k$ of dimension n of image I.

In the example of FIG. 3, the operation of projection of image I in a representation domain of dimension p adapted to the needs of a given application comprises multiplying column vector I by a first square diagonal matrix B of n*k rows and n*k columns and multiplying the column vector of dimension n*k resulting from multiplication B*I, by a second matrix A of n*k columns and p*n rows.

The k vectors of dimension n having their concatenation forming the vector of dimension n*k forming the diagonal of matrix B are here respectively designated as $b_1, \ldots, b_k$. In other words, vector $b_1$ comprises the n first values of the diagonal of matrix B, vector $b_2$ comprises the n next values of the diagonal of matrix B, and so on until vector $b_k$, which comprises the n last values of the diagonal of matrix B.

Matrix A is formed of p*k square sub-matrices $A_{j,l}$ of dimensions n*n arranged in p rows and k columns (where j, which is an integer in the range from 1 to k, designates the rank of the column of sub-matrix $A_{j,l}$, and where l is an integer in the range from 1 to p designating the rank of the row of sub-matrix $A_{j,l}$). A specificity of matrix A is that each sub-matrix $A_{j,l}$ is a diagonal matrix having n identical values on its diagonal, while the values of the diagonals of different sub-matrices $A_{j,l}$ may be different.

The projection operation of the example of FIG. 3 further comprises multiplying the column vector of dimension p*n resulting from multiplication A*B*I by a matrix S of p rows and p*n columns. Matrix S is only formed of '1's and of '0's. More particularly, each row of rank l of matrix S, l being an integer in the range from 1 to p, is formed by a vector comprising (l−1)*n '0's, followed by n '1's followed by (p−1)*n '0's. Multiplying by matrix S the column vector of dimension p*n resulting from multiplication A*B*I actually amounts to adding, for each of the p consecutive sub-vectors of dimension n forming this column vector, the n values of the sub-vector. The result of multiplication S*A*B*I is an output vector IT of p values, corresponding to the projection of image I in the representation domain of dimension p defined by matrices A and B.

In practice, any projection operation IT=G*I such as defined in the example of FIGS. 1 and 2 may be approximated by a projection operation of type IT=S*A*B*I such as defined in relation with FIG. 3. The determination of matrices A and B enabling to execute the desired projection operation will not be described in detail, since matrices A and B can be determined by means of usual methods of determining a transition matrix which is discriminating between classes of signals which are desired to be differentiated, for examples, methods based on a training from a set of previously-acquired reference images.

As an example, matrices A and B can be directly determined by the resolution of a regularization problem enabling to make sure that the projection operation performed by the system is the most relevant regarding a specific application. As an illustration, an application where images I supplied by a sensor are desired to be classified (or sorted), each image being assigned a category (for example, in the form of a number) selected from among $n_c$ predefined categories, where $n_c$ is an integer greater than 1, according to the value of projection vector IT of image I, is considered. A previously constituted training base, comprising, for each category s, s being an integer in the range from 1 to $n_c$, $n_s$ images $I_{s,rs}$ of the category, where $n_s$ is an integer greater than 1, and rs is an integer in the range from 1 to $n_s$ designating the rank of the image of category s in the training base, is further considered. In this case, matrices A and B may be determined by the resolution of a problem of the following type:

$$\mathrm{argmin}_{A,B}\left(\|\hat{G}(A,B)M - Id\|_{Fro}^2 - \sum_s \frac{\lambda_s}{n_s}\sum_{rs}\|\hat{G}(A,B)(I_{s,rs} - M_s)\|_2^2\right)$$

where $\hat{G}(A,B)$ is the resulting matrix such that $\hat{G}(A,B)=S*A*B$, $M_s$ is an averaged image corresponding to the average of the $n_s$ images $I_{s,rs}$ of category s, M is an averaged image corresponding to the average of all the images $I_{s,rs}$ of the training base, id is the identity matrix, and $\lambda_s$ is a regularization coefficient which may be set differently for each category.

As a variation, matrices A and B may be determined so that the resulting matrix $\hat{G}(A,B)$ is the closest approximation of a reference matrix G corresponding to the projection operation which is desired to be performed, according to predefined approximation criteria. As an example, it may be desired to minimize the Frobenius norm between matrix $\hat{G}(A,B)$ and matrix G by solving a minimization problem of the type:

$$\arg\min_{A,B}|\hat{G}(A,B)-G|_{Fro}^2,$$

where $\|\|_{Fro}$ designates the Frobenius norm.

More generally, any other method of determining matrices A and B may be used.

Figure 4:
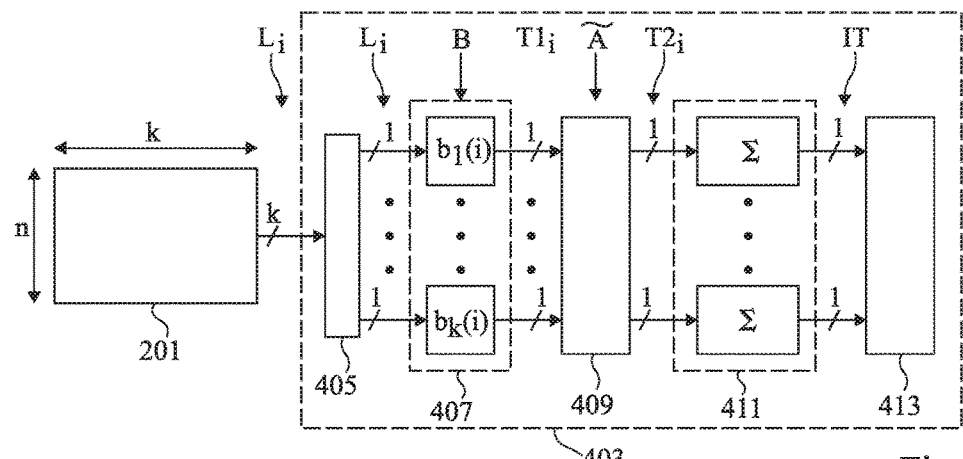
FIG. 4 is a block diagram of an embodiment of an acquisition system comprising an image sensor and a processing device capable of implementing an operation of projection, in a specific representation domain, of an image supplied by the sensor.

FIG. 4 is a block diagram of an example of an embodiment of an electronic acquisition system comprising an image sensor 201 of the above-defined type and an electronic processing device 403 capable of implementing the operation described in relation with FIG. 3 of projection of an image I supplied by the sensor, in a representation domain of dimension p defined by transition matrices A and B.

In this example, processing device 403 comprises a memory 405 of dimension k, capable of simultaneously storing the k output values of the pixels of a same row of image I.

During a phase of reading of an image acquired by sensor 201, the n rows of the sensor are successively read from. For each reading from a row of rank i of the sensor, vector $L_i$ of the output values of the row pixels, that is, the vector of dimension k formed by values $C_1(i), \ldots, C_k(i)$, is written into memory 405.

Processing device 403 further comprises a stage 407 capable, for each reading from a row of rank i of the sensor and before the reading from the next row, multiplying the k values $C_1(i), \ldots C_k(i)$ of vector $L_i$ stored in memory 405, respectively by the k coefficients $b_1(i), \ldots, b_k(i)$ of the diagonal of matrix B. Stage 407 for example comprises k multiplier circuits simultaneously performing the k multiplications $C_1(i)*b_1(i), \ldots, C_k(i)*b_k(i)$. Thus, for each reading from a row of rank i of the sensor and before the reading from the next row, stage 407 performs k multiplications among the n*k multiplications of matrix multiplication operation I*B of FIG. 3. $T1_i$ here designates the vector of dimension k supplied by stage 407, formed by values $C_1(i)*b_1(i), \ldots, C_k(i)*b_k(i)$.

Processing device 403 further comprises a stage 409 capable of receiving vector $T1_i$ of dimension k supplied by stage 407 for each reading from a row of rank i of the sensor, and of multiplying the vector by a matrix Ã of p rows and k columns, respectively comprising the p*k coefficients defining matrix A. In other words, matrix Ã comprises p*k coefficients $a_{j,1}$ arranged in p rows and k columns (where j designates the rank of the column of coefficient $a_{j,1}$ and where 1 designates the rank of the row of coefficient $a_{j,1}$), each coefficient $a_{j,1}$ being equal to the value of the single coefficient of the sub-matrix $A_{j,1}$ of same coordinates in matrix A. Thus, each time a vector $T1_i$ has been supplied by stage 407, and before the next vector $T1_i$ is supplied, stage 409 performs k*p multiplications among the n*k*p multiplications, in the example of FIG. 3, of the operation of multiplication of the vector resulting from product I*B by matrix A. $T2_i$ here designates the vector of dimension p supplied by stage 409, resulting from the multiplication of vector $T1_i$ by matrix Ã.

Processing device 403 further comprises a stage 411 of integration of the n vectors $T2_i$ successively supplied by stage 409 during the n successive readings from the sensor rows. Integration stage 411 is for example only reset between two successive phases of reading of an entire image I acquired by the sensor. Thus, at the end of a phase of reading from the sensor (that is, after the reading from the row of rank n of the sensor), stage 411 supplies an output vector IT of dimension p, having each coefficient IT(l), l being an integer in the range from 1 to p, equal to the sum of the coefficients of rank l $T2_1(l), \ldots T2_n(l)$ successively supplied by stage 409. Vector IT corresponds to the projection of image I in the representation domain of dimension p defined by matrices A and B. Stage 411 thus performs the summing operation corresponding, in the representation of FIG. 3, to the multiplication by matrix S of the result of product A*B*I.

Processing device 403 may further comprise a decision block 413 capable of receiving vector IT of dimension p supplied by integration stage 411 at the end of a phase of reading an image acquired by the sensor and of making one or a plurality of decisions according to the value of vector IT. As an example, decision block 413 is capable of classifying image I in a category selected from a plurality of predefined categories, according to the value of vector IT.

An advantage of the system of FIG. 4 is that processing device 403 needs not wait for the entire image I acquired by the sensor to have been read to start implementing the projection calculation operations. This provides a time gain since the calculation of the projection of image I in a representation domain different from the acquisition domain is carried out in parallel with the image reading.

Further, this enables to save memory resources, since it is no longer necessary to store the entire image acquired by the sensor before starting the calculation. In particular, in the example of FIG. 4, memory 405 is reduced to the dimension of a sensor row, that is, to a storage capacity of k values. As a comparison, memory 205 of processing device 203 of FIG. 2 should have a storage capacity of n*k values. As a variation, in the embodiment of FIG. 4, memory 405 may be omitted. In this case, for each reading from a row $L_i$ of the sensor, vector $L_i$ is directly transmitted to multiplication stage 407.

Another advantage of the system of FIG. 4 is that the storage of the coefficients of matrices A and B requires less memory resources than the storage of the coefficients of matrix G in the system of FIG. 2. More particularly, in the system of FIG. 4, the storage of matrix A requires storing p*k coefficients, and the storage of matrix B requires storing k*n coefficients. As a comparison, the storage of matrix G in the system of FIG. 2 requires storing n*k*p coefficients.

As an example, stages 407, 409, and 411 are cascaded and rated by a same clock signal, so that each stage executes the calculation operation which is assigned thereto between two consecutive rising or falling edges of the clock signal.

Figure 5:
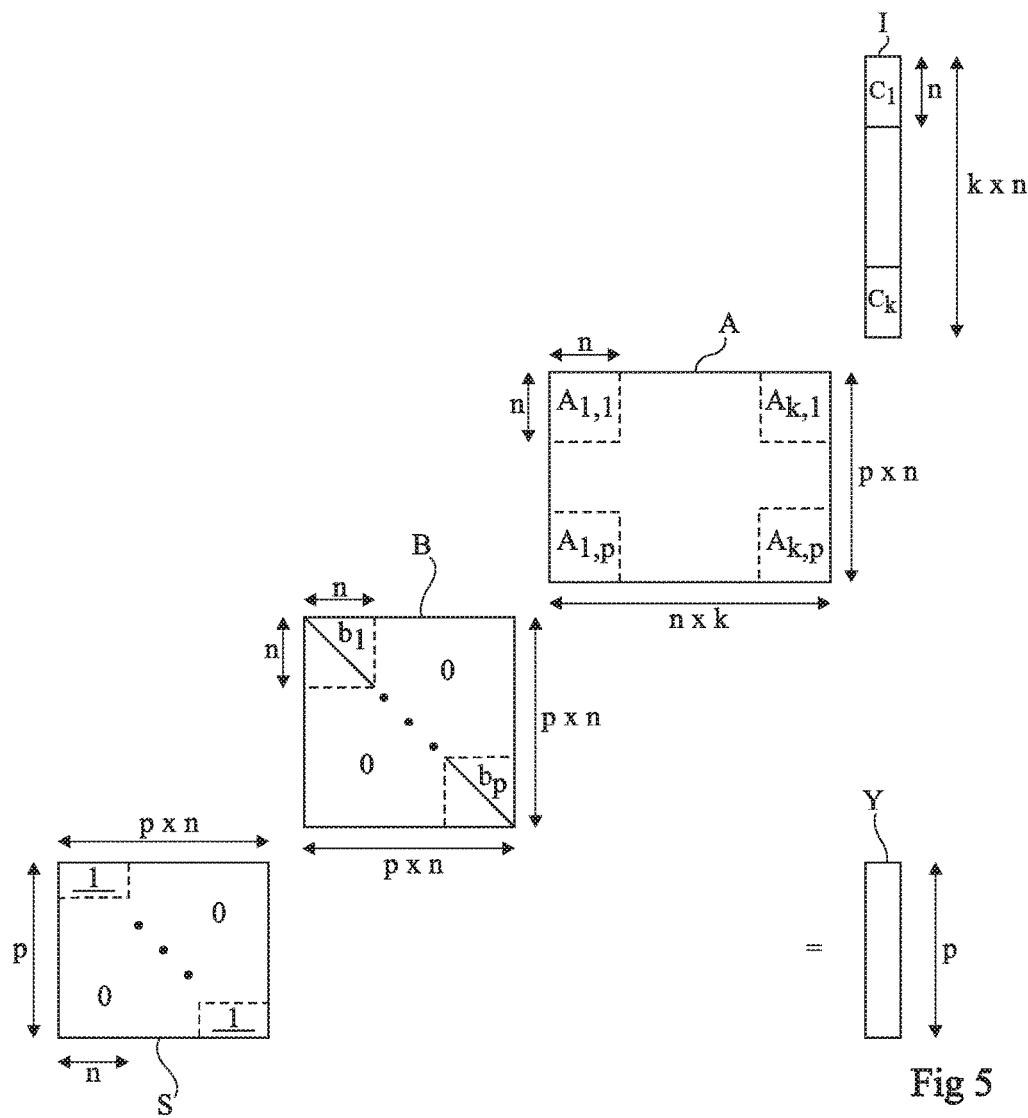
FIG. 5 schematically illustrates another embodiment of an operation of projection, in a specific representation domain, of an image supplied by an image sensor.

FIG. 5 schematically illustrates another embodiment of an operation of projection of an image I supplied by an image sensor such as defined hereabove, in a representation domain different from the acquisition domain.

As in the examples of FIGS. 1 and 3, image I is shown in FIG. 5 in the form of a column vector of k*n values corresponding to the concatenation of the k column vectors $C_1, \ldots, C_k$ of dimension n of image I.

In the example of FIG. 5, the operation of projection of image I in a representation domain of dimension p adapted to the needs of a given application comprises multiplying column vector I by a first matrix A of n*k columns and p*n rows and multiplying the column vector of dimension p*n resulting from multiplication A*I by a second matrix B of p*n columns and p*n rows.

Matrix B is a square diagonal matrix. The p vectors of dimension n having their concatenation forming the vector of dimension n*p forming the diagonal of matrix B are here respectively designated as $b_1, \ldots, b_p$. In other words, vector $b_1$ comprises the n first values of the diagonal of matrix B, vector $b_2$ comprises the n next values of the diagonal of matrix B, and so on until vector $b_p$, which comprises the n last values of the diagonal of matrix B.

Matrix A is formed of p*k square sub-matrices $A_{j,1}$ of dimensions n*n arranged in p rows and k columns (where j designates the rank of the column of sub-matrix $A_{j,1}$, and where 1 designates the rank of the row of sub-matrix $A_{j,1}$). As in the embodiment of FIG. 3, a specificity of matrix A is that each sub-matrix $A_{j,1}$ is a diagonal matrix having n identical values on its diagonal, while the values of the diagonals of different sub-matrices $A_{j,1}$ may be different.

The projection operation of the example of FIG. 5 further comprises multiplying the column vector of dimension p*n resulting from multiplication B*A*I by a matrix S of p rows and p*n columns, identical or similar to matrix S of FIG. 3.

The result of multiplication S*B*A*I is an output vector IT of p values, corresponding to the projection of image I in a representation domain of dimension p defined by matrices A and B.

In practice, any projection operation IT=G*I such as defined in the example of FIGS. 1 and 2 may be approximated by a projection operation of type IT=S*B*A*I such as defined in relation with FIG. 5. The determination of matrices A and B enabling to perform the desired projection operation may be achieved by methods similar to those described hereabove in relation with FIG. 3, or by any other adapted method.

Figure 6:
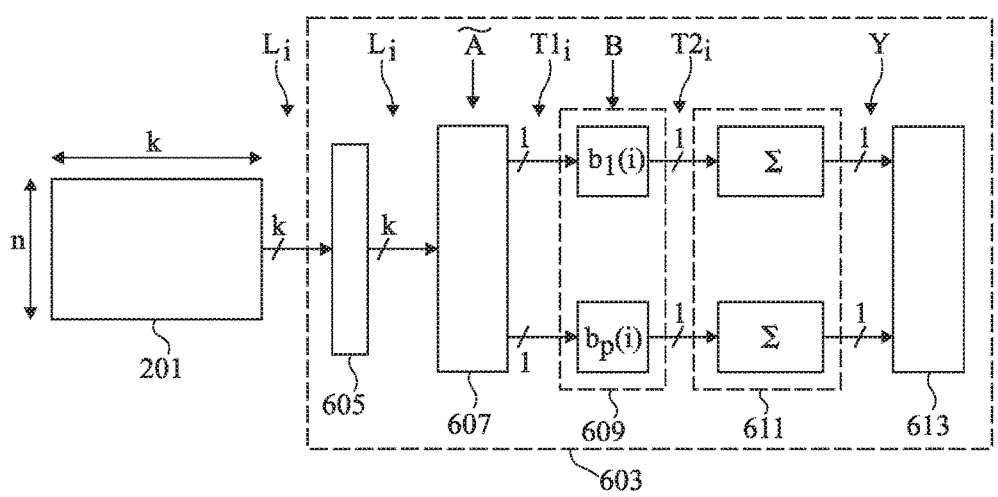
FIG. 6 is a block diagram of another embodiment of an acquisition system comprising an image sensor and a processing device capable of implementing an operation of projection, in a specific representation domain, of an image supplied by the sensor.

FIG. 6 is a block diagram of an example of an embodiment of an electronic acquisition system comprising an image sensor 201 of the above-defined type and an electronic processing device 603 capable of implementing the operation described in relation with FIG. 5 of projection of an image I supplied by the sensor in a representation domain of dimension p defined by transition matrices A and B.

In this example, processing device 603 comprises a memory 605 of dimension k, capable of simultaneously storing the k output values of the pixels of a same row of image I.

During a phase of reading of an image acquired by sensor 201, the n rows of the sensor are successively read from. For each reading from a row of rank i of the sensor, vector $L_i$ of the output values of the row pixels, that is, the vector of dimension k formed by values $C_1(i), \ldots, C_k(i)$, is written into memory 605.

Processing device 603 further comprises a stage 607 capable, each time a row of rank i is read from and before the reading from the next row, of multiplying vector $L_i$ stored in memory 605 by a matrix Ã of p rows and k columns respectively comprising p*k coefficients defining matrix A. Thus, each time a row of rank i of the sensor is read from and before the reading from the next row, stage 607 performs k*p multiplications among the n*k*p multiplications, in the example of FIG. 5, of multiplication operation I*A. $T1_i$ here designates the vector of dimension p supplied by stage 607, resulting from the multiplication of vector $L_i$ by matrix Ã.

Processing device 603 further comprises a stage 609 capable of receiving vector $T1_i$ of dimension p supplied by stage 607 each time a row of rank i of the sensor is read from, and of multiplying the p coefficients of this vector respectively by the p coefficients $b_1(i), \ldots, b_p(i)$ of the diagonal of matrix B. Stage 609 for example comprises p multiplying circuits simultaneously performing the p multiplications $T1_i(1)*b_1(i), \ldots, T1_i(p)*b_p(i)$. Thus, each time a row of rank i of the sensor is read from and before the reading from the next row, stage 609 performs p multiplications among the n*p multiplications, in the example of FIG. 5, of the operation of multiplication of the vector resulting from product A*I by matrix B. $T2_i$ here designates dimension p supplied by stage 609, formed by values $T1_i(1)*b_1(i), \ldots, T1_i(p)*b_p(i)$.

Processing device 603 further comprises a stage 611 of integration of the n vectors $T2_i$ successively supplied by stage 609 during the n successive readings from the sensor rows. Integration stage 611 is for example only reset between two successive phases of reading of an image I acquired by the sensor. Thus, at the end of a sensor reading phase (that is, after the row of rank n of the sensor has been read from), stage 611 supplies an output vector IT of dimension p, having each coefficient IT(l), l being an integer in the range from 1 to p, equal to the sum of the coefficients of rank l $T2_1(l), \ldots, T2_n(l)$ successively supplied by stage 609. Vector IT corresponds to the projection of image I in the representation domain defined by matrices A and B. Stage 611 thus performs the summing operation corresponding, in the representation of FIG. 5, to the multiplication by matrix S of the result of product B*A*I.

Processing device 603 may further comprise a decision block 613 capable of receiving vector IT of dimension p supplied by integration stage 611 at the end of a phase of reading an image acquired by the sensor and of making one or a plurality of decisions according to the value of vector IT. As an example, decision block 613 is capable of classifying image I in a category selected from a plurality of predefined categories, according to the value of vector IT.

As a variation, in the example of FIG. 6, memory 605 may be omitted. In this case, for each reading from a row $L_i$ of the sensor, vector $L_i$ is directly transmitted to multiplication stage 607.

The system of FIG. 6 is a variation of the system of FIG. 4, substantially having the same advantages as the system of FIG. 4 over the system of FIG. 2. A difference between the system of FIG. 6 and the system of FIG. 4 is that, in the system of FIG. 6, the number of multiplications performed to calculate the projection of image I is n*p(k+1), against n*k(1+p) in the system of FIG. 4. Further, the storage of the coefficients of matrices A and B in the system of FIG. 6 requires storing p*k+p*n values, against p*k+k*n values in the system of FIG. 4. According to the values of numbers p and k, it will be within the abilities of those skilled in the art to select the most advantageous system to minimize the storage needs and/or the calculation complexity.

As previously indicated, the coefficients of matrices A and B are stored in a memory, not shown in FIGS. 4 and 6, but belonging to processing device 403 or 603. In a "usage" mode of the processing device such as previously described, the coefficients of matrices A and B do not change. However, except in very specific cases where it is possible to analytically define the coefficients of matrices A and B, in most cases, the coefficients have been obtained after the implementation of a training process, for example, according to a problem resolution of the previously-described type, for example, of the following type:

$$\mathrm{argmin}_{A,B}\left( \left\| \hat{G}(A,B)M - Id \right\|_{Fro}^2 - \sum_s \frac{\lambda_s}{n_s} \sum_{rs} \left\| \hat{G}(A,B)(I_{s,rs} - M_s) \right\|_2^2 \right)$$

Thus, according to an advantageous embodiment of the present invention, the electronic system may further comprise an "embarked" electronic training device comprising:

a "reference" memory storing (temporarily or not) at least one reference value (for example a reference matrix G or at least a pair of reference input/output values, each pair including a reference vector I and an expected associated reference vector IT);

an optimum value calculation device (for example using a processor) capable of searching for coefficients of matrices A and B enabling to approach at best said at least one reference value; and a device for writing the coefficients of matrices A and B into the storage memory of the processing device (403, 603), where the stored values may be modified during the training process on request of the optimum value calculation device.

The embarked electronic training device is activated prior to the use of the electronic system, but may also be activated between two uses of the electronic system, for example, to implement a continuous training of matrices A and B.

An advantage of an electronic device including matrices A and B learnt during a prior training process (carried out by an embarked or external training device) and meeting the above-mentioned definitions $\hat{G}(A,B)=S*A*B$ is that it enables to carry out a processing potentially as accurately as a device of the state of the art (FIG. 1, with the storage of a complete matrix G) but more rapidly and with a lower need for storage resources. This is particularly true for applications of classification type or for the calculation of one or a plurality of parameters according to a regression method (for example, to simultaneously calculate different values of a physical parameter according to its own scale). A training method of SVM ("support vector machine") type, which enables to carry out a classification task with a simplified decision making, by thresholdings, based on vector IT (for example, a method equivalent to a multiclass linear SVM with a construction of "one versus all" type), may advantageously be used.

It should be noted that the use of matrices A and B with a prior training process is not intended to be only used to compress the size of the data originating from the sensor, but also to transform the input data into output data of another nature to enable to at least partly carry out a processing of these data to make a subsequent decision (control of an actuator, alarm, detection, measurements . . . ). The use of these output data (IT) may be immediate (if block 209 is connected to an electronic device responding/processing the data on the fly) or deferred (if block 209 is connected to a device for writing the data into the memory for a subsequent use). In both cases, output data IT are "entrusted" to another device of the electronic system for their storage or their immediate use.

It should be noted that in the above-described examples, each of numbers n and k is preferably greater than or equal to 2. As a variation, number n is greater than or equal to 2 and number k is equal to 1. Number p is preferably smaller than product n*k, so that the performed projection operation also is a dimension decrease operation, which enables to decrease the complexity of possible subsequent processsings, as well as the memory and energetic resource needs for the implementation of such subsequent processings.

The above-described examples concern image acquisition systems comprising conventional image sensors, where the light intensity values measured by the sensor and sequentially discharged are digital values quantized over a plurality of bits. As a variation, the embodiments of FIGS. 4 and 6 may be adapted to an image sensor supplying, each time a row $L_i$ is read from, pixel values quantized over a single bit, each pixel of the sensor being successively read from a plurality of times to construct a pixel value quantized over a plurality of bits. An example of such an image sensor is described in patent application FR No. 16/60627 filed by the Applicant on Nov. 3, 2016. In this case, each binary image supplied by the sensor may be projected on the fly by a processing device 403 or 603 of the above-described type, the projections of the successive binary images being then added to construct a final projected image.

The described embodiments more generally apply to any system comprising a sensor capable of discharging sequentially measured data, and where a descriptor (vector IT in the above examples) of a set of values measured by the sensor (image I in the above examples) is desired to be calculated, for example, to perform classification operations.

An example of application to multispectral imaging will now be described, the sensor of the acquisition system being capable of generating on the fly a plurality of histograms of a scene, respectively corresponding to different wavelength bands or spectral bands of the scene.

Figure 7:
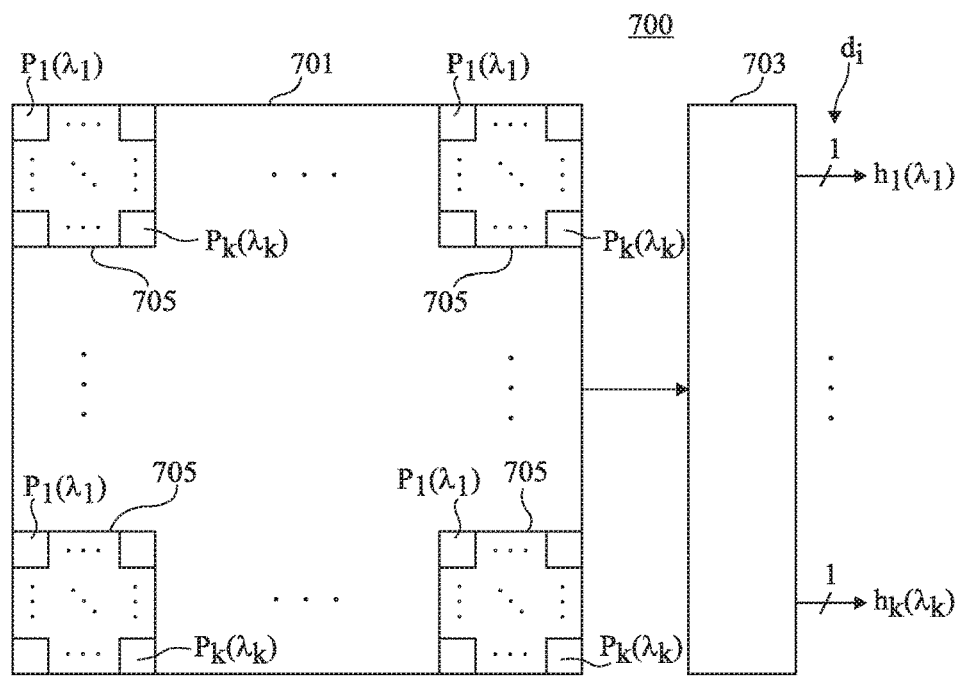
FIG. 7 schematically shows an example of a data sensor of a data acquisition system according to an embodiment.

FIG. 7 schematically shows a data sensor 700 comprising an asynchronous multispectral photosensitive sensor 701, and a histogram construction circuit 703 having an input connected to an output of sensor 701.

Sensor 701 comprises a plurality of pixels, for example arranged in an array of rows and columns. In this example, sensor 701 is divided into a plurality of pixel subsets 705. Pixel subsets 705 are for example identical or similar. As an example, pixel subsets 705 are regularly distributed over the entire sensor surface. In this example, each pixel subset 705 comprises k pixels $P_1, \ldots, P_k$, respectively capable of measuring light intensities received in k different spectral bands $\lambda_1, \ldots, \lambda_k$. To achieve this, each pixel $P_j$, j being an integer in the range from 1 to k, for example comprises a specific optical filter which only transmits a specific frequency band, different from the spectral bands transmitted by the optical filters of the other pixels of the subset, to a photoreceiver of the pixel.

Asynchronous sensor here means that the data measured by the sensor are asynchronously discharged instead of being discharged according to a predefined reading sequence. More particularly, in this example, each pixel is capable of integrating, for example, in a capacitive element of the pixel, an electric signal representative of a light intensity received by the pixel in its spectral sensitivity band since a time of beginning of an integration phase of the sensor, and of transmitting a turn-on indication signal on an output conductive track of the sensor when the signal integrated by the pixel exceeds a threshold (the pixel is said to turn on when the quantity of light energy received by the pixel in its spectral sensitivity band since the beginning of the integration exceeds a threshold). The output signal of the sensor is thus formed of a sequence of turn-on indication signals, for example, pulse signals. As an example, the turn-on indication signals emitted by the pixels are all identical (for example, in the form of Dirac pulses), but the turn-on indication signals emitted by pixels having different spectral sensitivities are emitted on different output conductive tracks of the sensor, which enables to discriminate the different spectral bands at the sensor output. As a variation, the turn-on indication signals are all emitted on a same output conductive track of the sensor, but the turn-on indication signals emitted by pixels having different spectral sensitivities have different features, for example, different shapes, to be able to discriminate the different spectral bands at the sensor output.

Circuit 703 is capable of receiving the turn-on indication signals supplied by sensor 701, and of counting, in predefined time intervals defining histogram classes, the number of turn-on indication signals transmitted by the sensor for each of the spectral sensitivity bands of the sensor. Circuit 703 thus constructs k histograms $h_1, \ldots, h_k$ of the scene, respectively corresponding to the k sensor spectral sensitivity bands $\lambda_1, \ldots, \lambda_k$.

Figure 8:
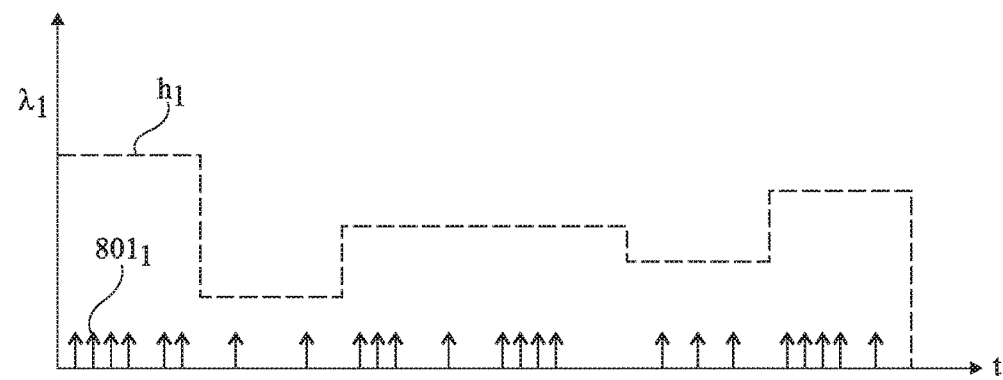
FIG. 8 is a simplified timing diagram schematically showing the data measured by the sensor of FIG. 7.
Figure 8:
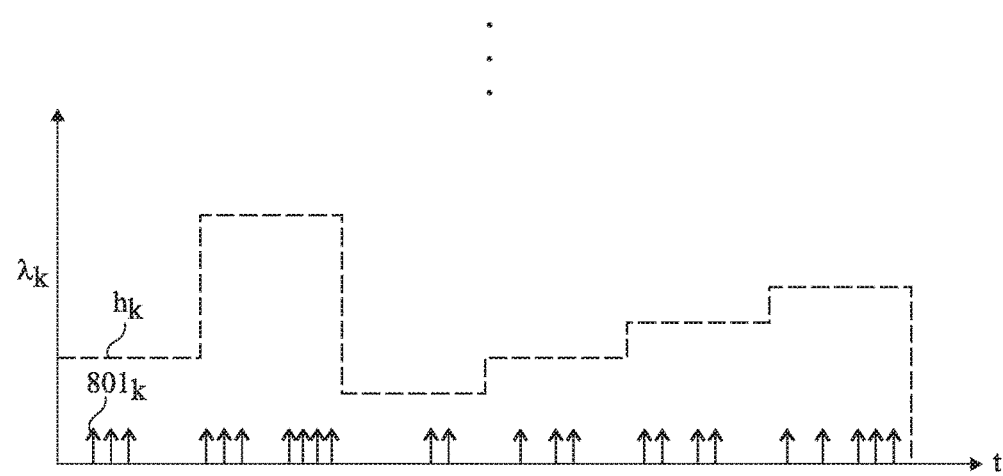

FIG. 8 is a timing diagram schematically illustrating the data supplied by sensor 701 and by histogram construction circuit 703 of FIG. 7. FIG. 8 more particularly shows the time variation for each spectral sensitivity band $\lambda_j$ of sensor 701, of turn-on indication signals $801_j$ (represented by vertical arrows in the drawing) emitted by pixels $P_j$ of sensor 701, and of histogram signal $h_j$ (in dash lines) supplied by circuit 703.

It should be noted that although sensor 701 is asynchronous, histogram construction circuit 703 has a synchronous operation. More particularly, the output signals of circuit 703 are synchronous signals.

It is here considered that the k histograms $h_1, \ldots h_k$ constructed by circuit 703 all have a same number n of classes, and that the classes of same rank i (i being an integer in the range from 1 to n) of the different histograms have the same width. The width of the histogram classes may be constant or time-variable (that is according to their rank i).

Thus, circuit 703 successively provides n vectors $d_i$ of dimensions k, each vector $d_i$ being formed by the sequence of values $h_1(i), \ldots, h_k(i)$ of the classes of rank i of the k histograms $h_1, \ldots, h_k$.

Sensor 700 thus forms a histogram sensor capable of generating on the fly a plurality of histograms of a scene respectively corresponding to different spectral bands of the scene, the sensor sequentially outputting the measured histogram data.

A processing device of the type described hereabove in relation with FIGS. 3, 4, 5, and 6 may be coupled to sensor 700, to project the set of histogram data acquired by the sensor, in a specific representation domain capable, for example, of implementing classification operations. To achieve this, sensor 201 of FIGS. 4 and 6 may for example be replaced with histogram sensor 700 of FIG. 7 and, in the representations of FIGS. 3 to 6, vectors $C_1, \ldots, C_k$ of dimension n respectively may be replaced with vectors $h_1, \ldots, h_k$ of dimension n, and vectors $L_1, \ldots, L_n$ of dimension k may be respectively replaced with vectors $d_1, \ldots, d_n$ of dimension k.

As a variation, the acquisition system thus obtained may be adapted to the case where k=1, that is, to the case of an asynchronous photosensitive sensor having a single spectral sensitivity band.

Further, the application described hereabove in relation with FIGS. 7 and 8 may be adapted to the case where, for each spectral sensitivity band $\lambda_j$ of sensor 701, the histogram construction circuit constructs not only a single histogram $h_j$, but a plurality of histogram of different scales, that is, having different class widths.

Figure 9:
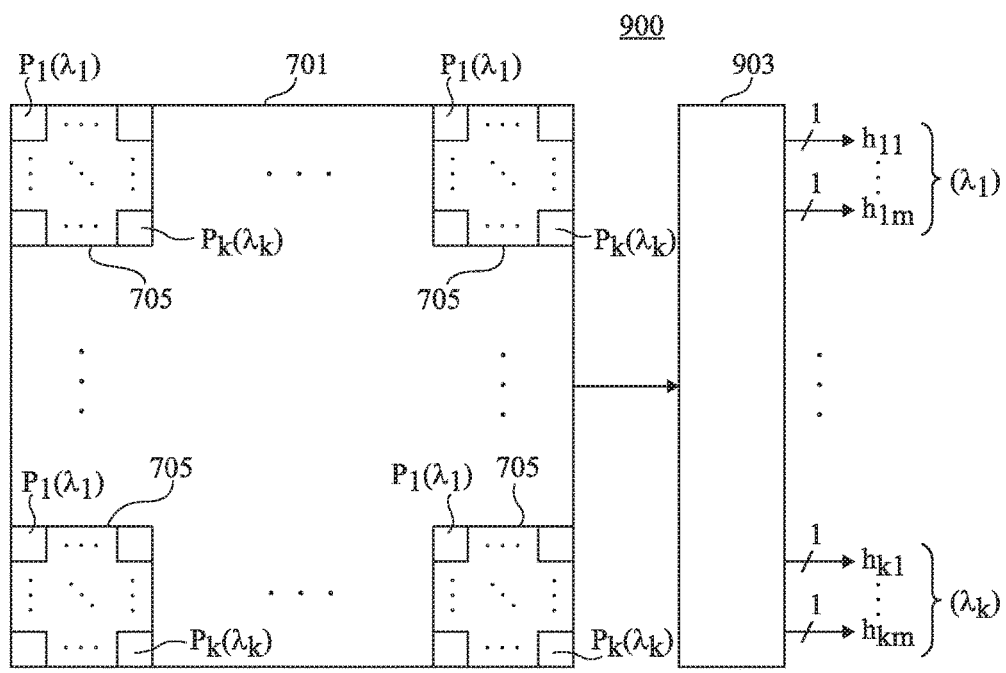
FIG. 9 schematically shows another example of a data sensor of a data acquisition system according to an embodiment.
Figure 10:
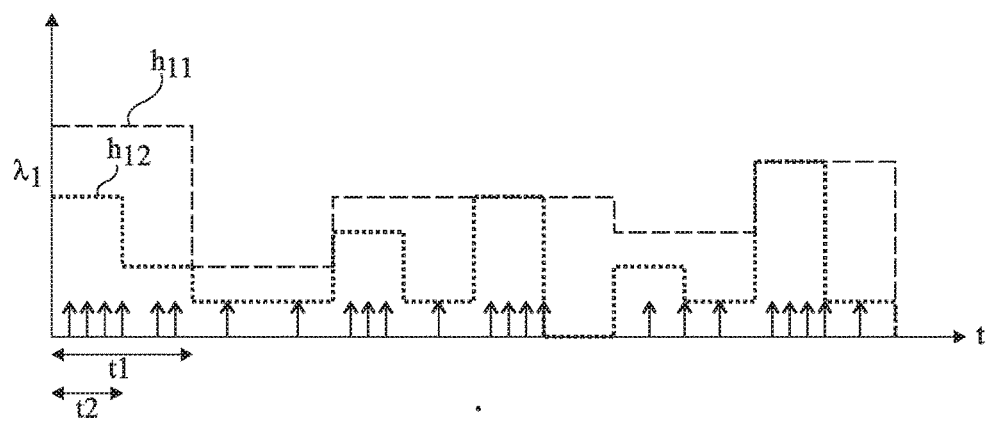
FIG. 10 is a simplified timing diagram schematically showing the data measured by the sensor of FIG. 9.
Figure 10:
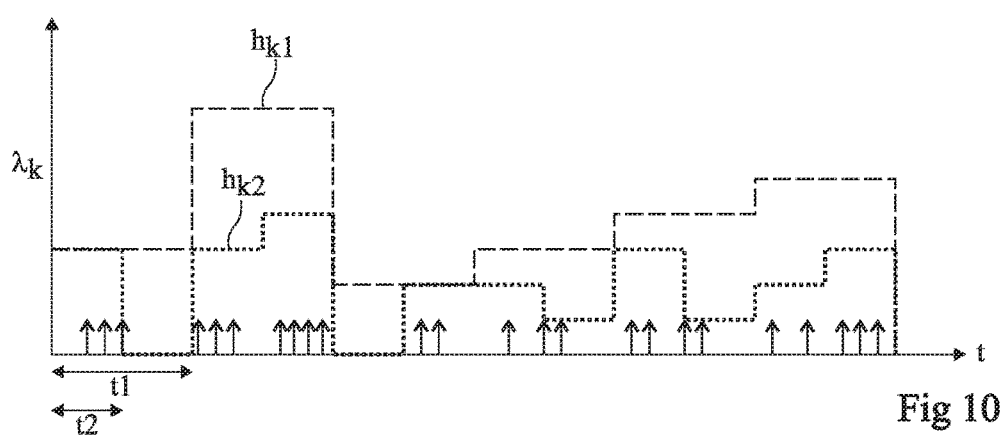

This configuration is schematically shown in FIGS. 9 and 10.

FIG. 9 schematically shows a data sensor 900 which differs from sensor 700 of FIG. 7 in that, in the example of FIG. 9, histogram construction circuit 703 is replaced with a histogram construction circuit 903 supplying, for each spectral band $\lambda_j$, m histograms $h_{j1}, \ldots, h_{jm}$ (where m is an integer greater than or equal to 2) having different scales.

FIG. 10 is a timing diagram schematically illustrating the data supplied by sensor 701 and by histogram construction circuit 903 of FIG. 9. FIG. 10 particularly shows, for each spectral sensitivity band $\lambda_j$ of sensor 701, turn-on indication signals $801_j$ (shows by vertical arrows in the drawing) emitted by pixels $P_j$ of the sensor. FIG. 10 further shows, for each spectral band $\lambda_j$, two histograms hj1 and $h_j2$ (m=2 in this example), respectively in dash lines and in dotted lines, generated by circuit 903. As appears in the drawing, histograms $h_{j1}$ and $h_{j2}$ have different class widths (or scales). In other words, for each spectral band $\lambda_j$, the time interval t1 during which circuit 903 counts the turn-on indication signals emitted by pixels $P_j$ to supply a value of histogram $h_{j1}$ is different from the time interval t2 during which circuit 903 counts the turn-on indications signals emitted by pixels $P_j$ to supply a value of histogram $h_{j2}$.

It is here considered that for each integer index u in the range from 1 to m, the k histograms $h_{1u}, \ldots h_{ku}$ constructed by circuit 903 all have a same integer number $n_u$ of classes and that the classes of same rank $i_u$ ($i_u$ being an integer in the range from 1 to $n_u$) of the different histograms of rank u have the same width. The width of the classes of histograms $h_{1u}, \ldots, h_{ku}$ may be constant or time-variable (that is according to their rank $i_u$).

Circuit 903 thus successively provides, for each index u in the range from 1 to m, $n_u$ vectors $d_{iu}$ of dimensions k, each vector $d_{iu}$ being then formed of values $h_{1u}(i_u), \ldots, h_{ku}(i_u)$ of the classes of rank $i_u$ of the k histograms $h_{1u}, \ldots, h_{ku}$.

Sensor 900 thus forms a histogram sensor capable of generating on the fly a plurality of multiscale histograms of a scene respectively corresponding to different spectral bands of the scene, the sensor sequentially outputting the measured histogram data.

m processing devices of the type described hereabove in relation with FIGS. 3, 4, 5, and 6 may be coupled to sensor 900, to project on the fly, for each histogram scale of index u, the set of histogram data acquired by the sensor, in a representation domain capable, for example, of implementing classification operations. As an example, m processing circuits $403_u$ or $603_u$ similar to above-described processing circuits 403 or 603 may be coupled, at the output of histogram sensor 900 of FIG. 9, by replacing, for each processing device of index u, vectors $C_1, \ldots C_k$ of dimension n (considering the notations used in relation with FIGS. 4 to 6), respectively with vectors $h_{1u}, \ldots, h_{ku}$ of dimension $n_u$ (considering the notations used in relation with FIGS. 9 and 10), and vectors $L_1, \ldots L_n$ of dimension k (considering the notations used in relation with FIGS. 4 to 6), respectively with vectors $d_{1u}, \ldots, d_{nu}$ of dimension k (considering the notations used in relation with FIGS. 9 and 10).

As a variation, the acquisition system thus obtained may be adapted to the case where k=1, that is, to the case of a multi-scale histogram sensor having a single spectral sensitivity band.

Specific embodiments have been described. Various alterations and modifications will occur to those skilled in the art. In particular, the described embodiments are not limited to the examples of application described hereabove, but can more generally apply to any acquisition system comprising a sensor capable of sequentially outputting measured data, where it is desired to be able to calculate on the fly a projection of a set of measurements provided by the sensor in a representation domain different from the acquisition domain, for example, to perform classification operations.

An example of hyperspectral classification application may comprise dividing a hyperspectral image sensor of x*y pixels and z spectral bands, x, y, and z being integers greater than 1, into u subsets of v*w pixels and z spectral bands (u, v, and w being integers greater than 1 such that x=u*v and y=u*w). Each subset may be associated with a readout circuit and a processing device of the type described hereabove. At the end of an acquisition phase, each pixel subset is assigned a category selected from a set of a plurality of categories, according to the value of a descriptor calculated from the hyperspectral histogram data of the subset. Such a system may for example be used to automatically process satellite or air images to discriminate the different categories of elements (road, woods, water, building, etc.) likely to form a scene, for example, for mapping applications.

What is claimed is:

1. An electronic system comprising:
a sensor capable of successively supplying n vectors $L_i$ each comprising k measured values $L_i(j)$, where n and k are integers with n≥2 and k≥1, i is an integer in the range from 1 to n, and j is an integer in the range from 1 to k; and
an electronic device for processing on the fly the values measured by the sensor, capable of providing a projection $\hat{G}(A,B)*I$, in a representation domain of dimension p, of the set of n*k values $L_i(j)$ measured by the sensor, p being an integer with p≥1, I being a column vector of n*k values, formed by the set of n*k values $L_i(j)$ measured by the sensor, and $\hat{G}(A,B)$ being a projection matrix of p rows and n*k columns such that $\hat{G}(A,B)=S*A*B$, where B is a square diagonal matrix with n*k rows and n*k columns, and A is a matrix of n*k columns and p*n rows formed of p*k square sub-matrices of dimensions en arranged in p rows and k columns, each square sub-matrix being a diagonal matrix having n identical values on its diagonal, and where S is a matrix of p rows and p*n columns, having each row of rank 1, 1 being an integer in the range from 1 to p, formed by a vector comprising (l−1)*n zero coefficients followed by n unit coefficients followed by (p−1)*n zero coefficients, the electronic processing device comprising:
a first stage capable, each time a vector $L_i$ has been supplied by the sensor and before the next vector $L_i$ is supplied, of multiplying the k values $L_i(j)$ of vector $L_i$ by respectively k coefficients $b_i(j)$, and of supplying a vector $T1_i$ of k values $T1_i(j)$ resulting from the multiplication;
a second stage capable, each time a vector $T1_i$ has been supplied by the first stage and before the next vector $T1_i$ is supplied, of multiplying vector $T1_i$ by a matrix $\tilde{A}$ of k*p coefficients, and of supplying a vector $T2_i$ of p values $T2_i(l)$ resulting from the multiplication, where l is an integer in the range from 1 to p; and
a third stage of digitally integrating the n vectors $T2_i$ successively supplied by the second stage and of supplying an output vector IT of p values IT(l), corresponding to projection $\hat{G}(A,B)*I$.

2. An electronic system comprising:
a sensor capable of successively supplying n vectors $L_i$ each comprising k measured values $L_i(j)$, where n and k are integers with n≥2 and k≥1, i is an integer in the range from 1 to n, and j is an integer in the range from 1 to k; and
an electronic device for processing on the fly the values measured by the sensor, capable of providing a projection $\hat{G}(A,B)*I$, in a representation domain of dimension p, of the set of n*k values $L_i(j)$ measured by the sensor, p being an integer with p≥1, I being a column vector of n*k values, formed by the set of n*k values $L_i(j)$ measured by the sensor, and $\hat{G}(A,B)$ being a projection matrix of p rows and n*k columns such that $\hat{G}(A,B)=S*B*A$, where B is a square diagonal matrix with p*n columns and p*n rows, where A is a matrix of n*k columns and p*n rows formed of p*k square sub-matrices of dimensions n*n arranged in p rows and k columns, each square sub-matrix being a diagonal matrix having n identical values on its diagonal, and where S is a matrix of p rows and p*n columns, having each row of rank 1, 1 being an integer in the range from 1 to p, formed by a vector comprising (l−1)*n zero coefficients followed by n unit coefficients followed by (p−1)*n zero coefficients, the electronic processing device comprising:
a first stage capable, each time a vector $L_i$ has been supplied by the sensor and before the next vector $L_i$ is supplied, of multiplying vector $L_i$ by a matrix $\tilde{A}$ of k*p coefficients, and of supplying a vector $T1_i$ of p values $T1_i(l)$ resulting from the multiplication, where l is an integer in the range from 1 to p;

a second stage capable, each time a vector $T1_i$ has been supplied by the first stage and before the next vector $T1_i$ is supplied, of multiplying the p values $T1_i(l)$ of vector $T1_i$ by respectively p coefficients $b_i(l)$, and of supplying a vector $T2_i$ of p values $T2_i(l)$ resulting from the multiplication; and a third stage capable of digitally integrating then vectors $T2_i$ successively supplied by the second stage and of supplying an output vector IT of p values IT(l), corresponding to projection $\hat{G}(A,B)*I$.

3. The system of claim 1, wherein the first, second, and third stages are cascaded and rated by a same clock signal, so that each stage executes the calculation operation which is assigned thereto between two consecutive rising or falling edges of the clock signal.

4. The system of claim 1, wherein k is an integer greater than or equal to 2.

5. The system of claim 1, wherein the processing device further comprises a fourth stage capable of receiving vector IT of dimension p supplied by the third stage and of making one or a plurality of decisions according to the value of vector IT.

6. The system of claim 5, wherein the fourth stage is capable of classifying the set of n*k values measured by the sensor in a selected category from a plurality of predefined categories, according to the value of vector IT.

7. The system of claim 5, wherein the fourth stage is capable of controlling a user electronic device according to the value of vector IT.

8. The system of claim 1, wherein the sensor is image sensor comprising a plurality of pixels arranged in n rows and k columns, capable of successively supplying n vectors $L_i$, each vector $L_i$ corresponding to all the output values of the pixels of a same row of the sensor.

9. The system of claim 8, wherein the output values of the sensor pixels are digital values quantized over a plurality of bits.

10. The system of claim 8, wherein the output values of the sensor pixels are binary values, and wherein the sensor is read from a plurality of times, the processing device supplying, for each read operation, a projection of the binary image supplied by the sensor, the system being capable of adding the projections of the binary images successively supplied by the processing device to supply a final projected image.

11. The system of claim 1, wherein the sensor is a histogram sensor comprising an asynchronous multispectral photosensitive sensor and a histogram construction circuit having an input connected to an output of the photosensitive sensor.

12. The system of claim 11, wherein the histogram construction circuit is capable of supplying k histograms of a scene seen by the photosensitive sensor, respectively corresponding to k different spectral bands of the scene.

13. The system of claim 12, wherein the histogram construction circuit is capable of supplying, for each spectral band, m histograms of the scene having different scales.

14. The system of claim 1, comprising a plurality of juxtaposed identical sensors and, for each sensor, an electronic device for processing on the fly the values measured by the sensor, the system being capable of for each sensor, classifying a set of values measured by the sensor in a selected category from a plurality of predefined categories, according to the value of the vector IT calculated by the processing device associated with the sensor.

15. The system of claim 1, further comprising an electronic training device comprising:

a reference memory storing at least one reference value for example corresponding to coefficients of a reference projection G or to a t least a pair of reference input/output values, each pair including a reference vector I and an expected associated reference vector IT;

art optimum value calculation device capable of searching for coefficients of matrices A and B enabling to approach at best said at least one reference value; and a device for writing the coefficients of matrices A and B into a storage memory of the electronic processing device, where the stored values may be modified during a training process on request of the optimum value calculation device.

16. The system of claim 2, wherein the first, second, and, third stages are cascaded and rated by a same clock signal, so that each stage executes the calculation operation which, is assigned thereto between two consecutive rising or falling edges of the clock signal.

17. The system of claim 2, wherein k is an integer greater than or equal to 2.

18. The system of claim 2, wherein the processing device further comprises a fourth stage capable of receiving vector IT of dimension p supplied by the third stage, and of making one or a plurality of decisions according to the value of vector IT.

19. The system of claim 18, wherein the fourth stage is capable of classifying the set of n*k values measured by the sensor n a selected category from a plurality of predefined categories, according to the value of vector IT.

20. The system of claim 18, wherein the fourth stage is capable of controlling a user electronic device according to the value of vector IT.

21. The system of claim 2, wherein the sensor is an image sensor comprising a plurality of pixels arranged in n rows and k columns, capable of successively supplying n vectors $L_i$, each vector $L_i$ corresponding to all the output values of the pixels of a same row of the sensor.

22. The system of claim 21, wherein the output values of the sensor pixels are digital values quantized over a plurality of bits.

23. The system of claim 21, wherein the output values of the sensor pixels are binary values, and wherein the sensor is read from a plurality of times, the processing device supplying, for each read operation, a projection of the binary image supplied by the sensor, the system being capable of adding the projections of the binary images successively supplied by the processing device to supply a final projected image.

24. The system of claim 2, wherein the sensor is a histogram sensor comprising an asynchronous multispectral photosensitive sensor and a histogram construction circuit having an input connected to an output of the photosensitive sensor.

25. The system of claim 24, wherein the histogram construction circuit is capable of supplying k histograms of a scene seen by the photosensitive sensor, respectively corresponding to k different spectral bands of the scene.

26. The system of claim 25, wherein the histogram construction circuit is capable of supplying, for each spectral band, m histograms of the scene having different scales.

27. The system of claim 2, comprising a plurality of juxtaposed identical sensors and, for each sensor, an electronic device for processing on the fly the values measured by the sensor, the system being capable of, for each sensor, classifying a set of values measured by the sensor in a selected category from a plurality of predefined categories, according to the value of the vector IT calculated by the processing device associated with the sensor.

28. The system of claim 2, further comprising an electronic training device comprising:
- a reference memory storing at least one reference value for example corresponding to coefficients of a reference projection G or to at least a pair of reference input/output values, each pair including a reference vector I and an expected associated reference vector IT;
- an optimum value calculation device capable of searching coefficients of matrices A and B enabling to approach at best said at least one reference value; and
- a device for writing the coefficients of matrices A and B into a storage memory of the electronic processing device, where the stored values may be modified during a training process on request of the optimum value calculation device.

* * * * *